United States Patent [19]

Ishizumi et al.

[11] Patent Number: 5,730,802
[45] Date of Patent: Mar. 24, 1998

[54] VAPOR GROWTH APPARATUS AND VAPOR GROWTH METHOD CAPABLE OF GROWING GOOD PRODUCTIVITY

[75] Inventors: Takashi Ishizumi, Kitakatsuragi-gun; Shinji Kaneiwa, Nara, both of Japan

[73] Assignee: Sharp Kabushiki Kaisha, Osaka, Japan

[21] Appl. No.: 777,299

[22] Filed: Dec. 27, 1996

Related U.S. Application Data

[63] Continuation of Ser. No. 423,952, Apr. 18, 1995, abandoned.

[30] Foreign Application Priority Data

May 20, 1994 [JP] Japan .................... 6-106760

[51] Int. Cl.$^6$ .................... C23C 16/00
[52] U.S. Cl. .................... 118/719; 118/730; 427/248.1; 427/255.2; 427/255.7
[58] Field of Search .................... 118/719, 730; 427/248.1, 255.2, 255.7

[56] References Cited

U.S. PATENT DOCUMENTS

| | | | |
|---|---|---|---|
| 3,785,853 | 1/1974 | Kirkman | 118/719 |
| 4,058,430 | 11/1977 | Suntola | 118/719 |
| 4,480,585 | 11/1984 | Gattuso | 118/719 |
| 4,986,214 | 1/1991 | Zumoto | 118/722 |
| 5,108,779 | 4/1992 | Gasworth | 427/249 |
| 5,281,274 | 1/1994 | Yoder | 118/730 |
| 5,338,362 | 8/1994 | Imahashi | 118/719 |

FOREIGN PATENT DOCUMENTS

| | | | |
|---|---|---|---|
| 0015390 | 9/1980 | European Pat. Off. | |
| 0175030 | 3/1986 | European Pat. Off. | |
| 62-26811 | 2/1987 | Japan | 118/730 |
| 1526694 | 9/1978 | United Kingdom | |

OTHER PUBLICATIONS

Denbaars et al, "Atomic Layer Epitaxy of Compound Semiconductors with Metalorganic Precursors", Journal of Crystal Growth, vol. 98, No. ½, 1 Nov. 1989, Amsterdam, NL, pp. 195–208.

Patent Abstracts of Japan, vol. 9, No. 233 (C–304) (1956) 19 Sep. 1985 & JP–A–60 090 8 (Fujitsu K.K.) 22 May 1985.

Tischler et al, "Growth and Characterization of Compound Semiconductors by Atomic Layer Epitaxy", Journal of Crystal Growth, vol. 77, No. 1–3, Sep. 1986, Amsterdam, NL, pp. 89–94.

Bedair et al, "Atomic Layer Epitaxy of III–V Binary Compounds", Applied Physics Letters, vol. 47, No. 1, Jul. 1985, New York US, pp. 51–53.

Dip et al, "Atomic Layer Epitaxy of GaAs with a 2μm/h Growth Rate", Applied Physics Letters, vol. 62, No. 19, 10 May 1993, New York US, pp. 2378–2380.

Sumakeris et al, "Layer b Layer Epitaxial Growth of GaN at Low Temperatures", Thin Solid Films, vol. 225, No. 1/2, 25 Mar. 1992, Lausanne, CH, pp. 244–249.

Bedair et al, "Gallium Arsenide and Related Compounds 1990; Atomic Layer Epitaxy of GaAs and AlGaAs", Inst. phys. Conf. Ser. vol. 112, Sep. 1990, Bristol, PH, USA, pp. 143–148.

*Primary Examiner*—Richard Bueker
*Attorney, Agent, or Firm*—Nixon & Vanderhye, P.C.

[57] ABSTRACT

A vapor growth apparatus and a vapor growth method is capable of growing a compound semiconductor layer having an evenness and an interfacial sharpness in units of atomic layers with a good productivity. A growth chamber has a cylindrical portion and an end plate which closes an upstream end of the cylindrical portion. The end plate is provided with a cation gas material supply inlet and an anion material gas supply inlet, while an exhaust device is provided on the downstream side of the cylindrical portion. A substrate holder having a substrate support surface is provided in the cylinder portion. A gas separating member separates flow paths of material gases from each other, thereby forming on the substrate support surface a plurality of material gas supply areas to which the material gases are independently supplied. A drive device rotates the substrate holder with a substrate set on the substrate support surface thereof around the center line of the cylindrical portion. Then a cation material and an anion material gas are alternately supplied to the surface of the substrate.

1 Claim, 8 Drawing Sheets

Fig. 1
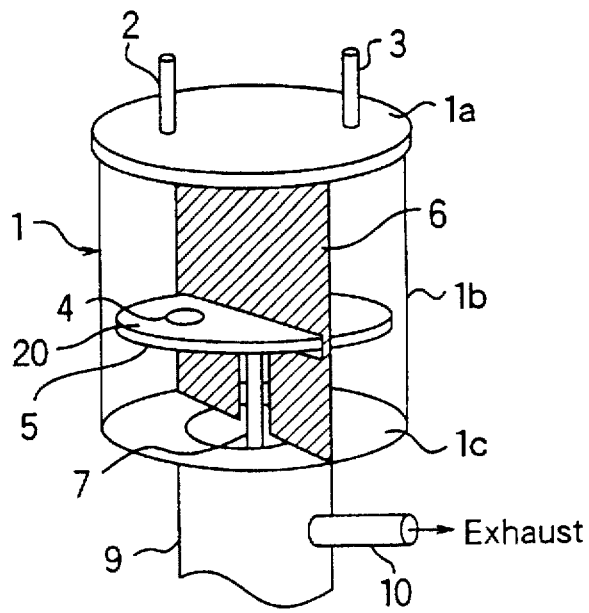
Fig. 2A
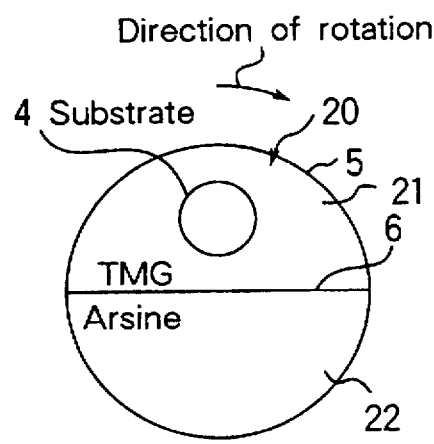
Fig. 2B  TMG 
Fig. 2C  Arsine 
→ Time

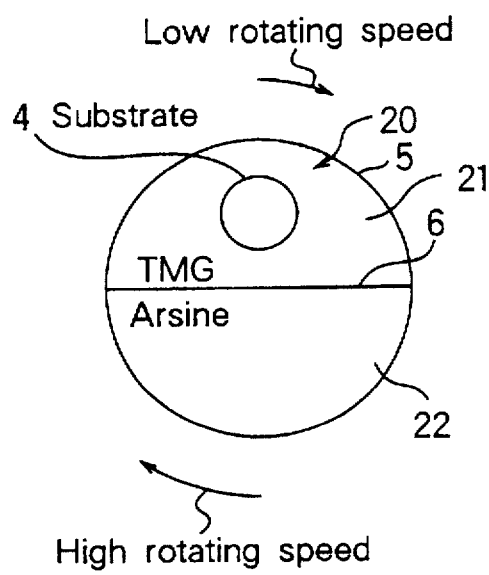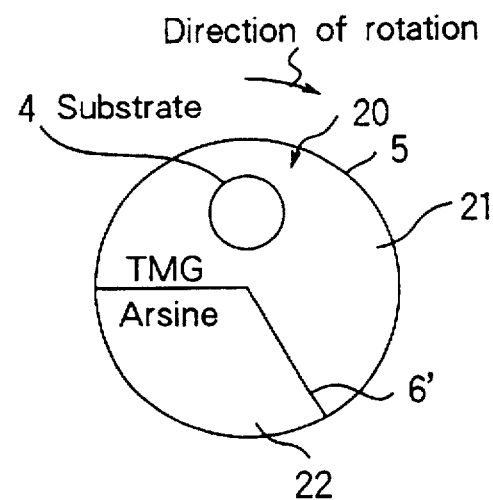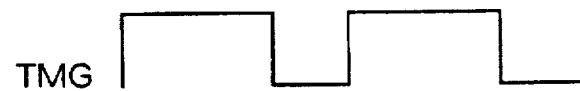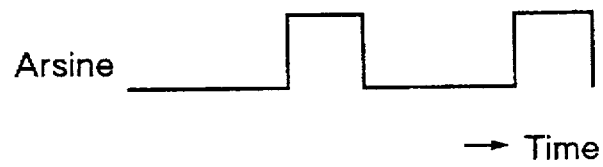

Fig.4
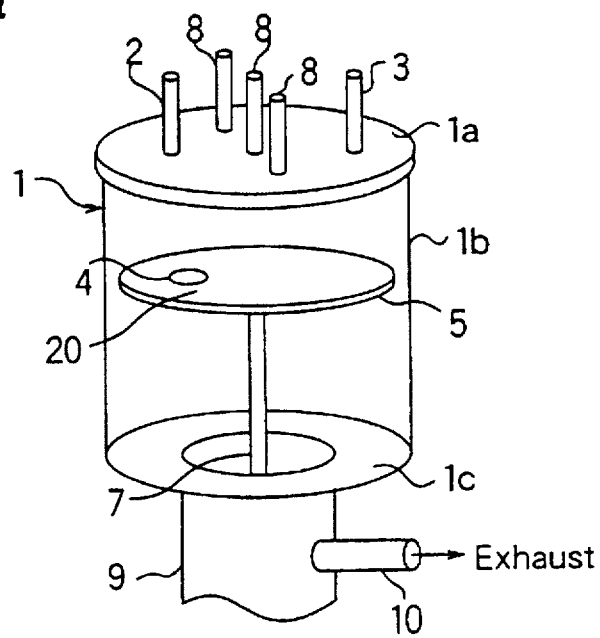
Fig.5A
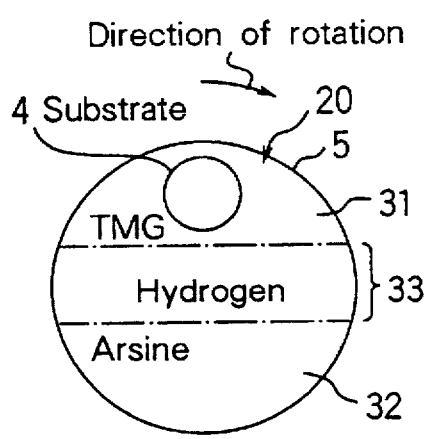
Fig.5B  TMG 
Fig.5C  Purging with hydrogen 
Fig.5D  Arsine 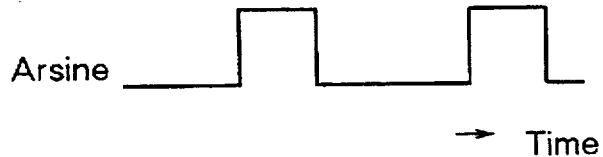
→ Time Fig.6
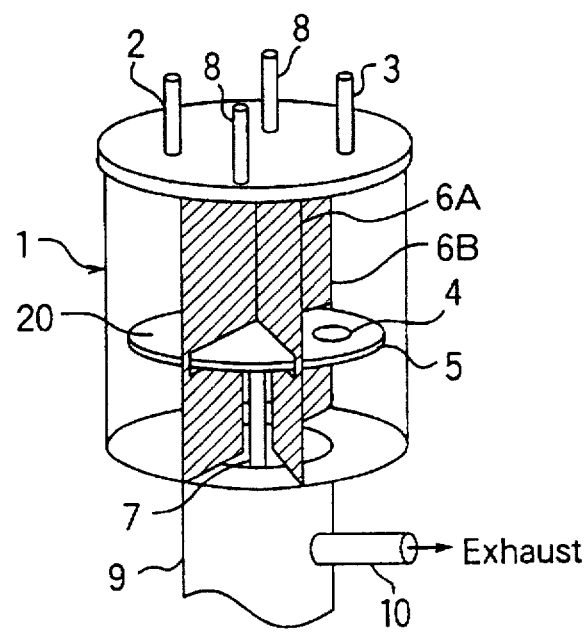
Fig.7A
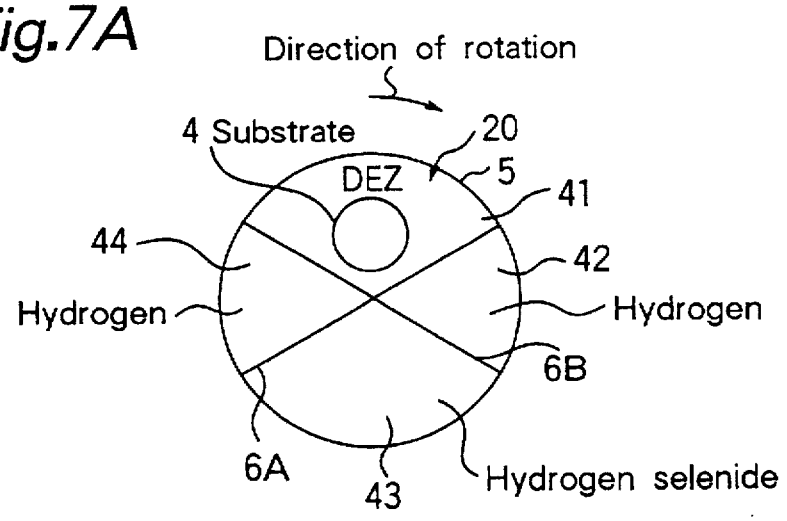
Fig.7B    DEZ
Fig.7C    Purging with hydrogen
Fig.7D    Hydrogen selenide
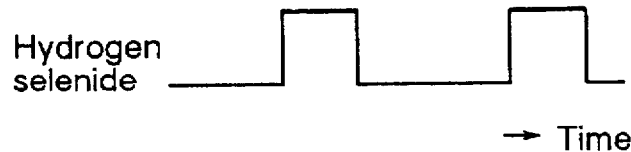
→ Time

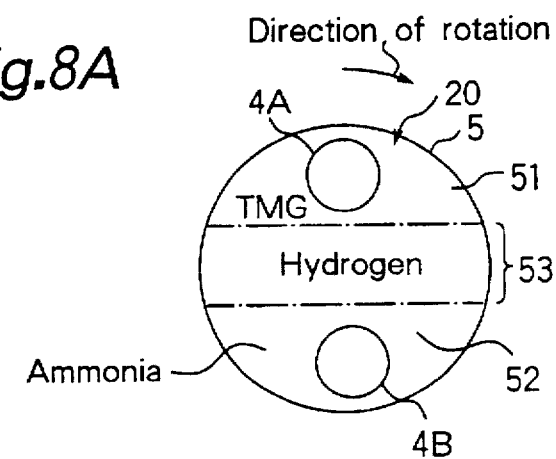
Fig.8A
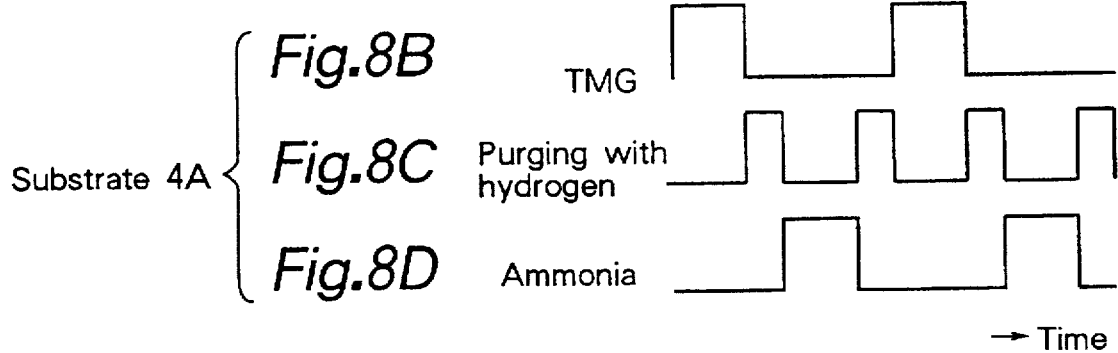
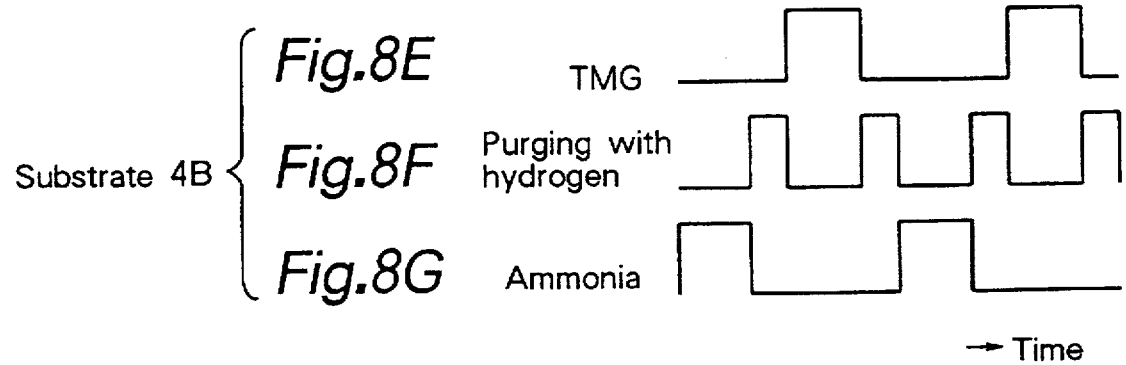

Fig.9A
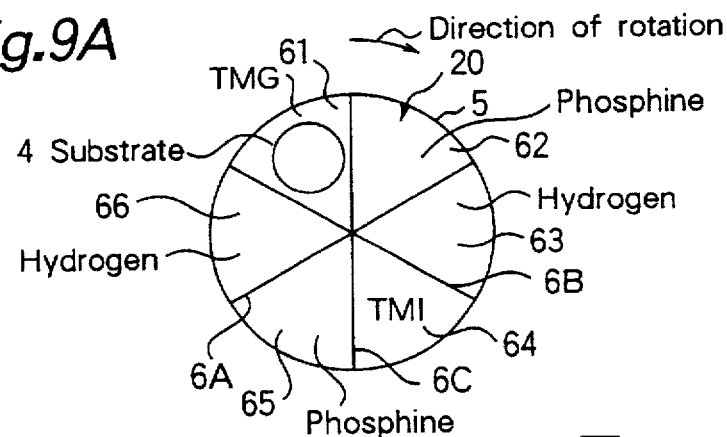
Fig.9B TMG 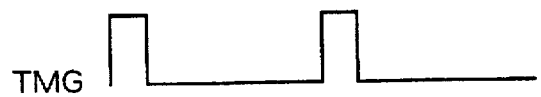
Fig.9C TMI 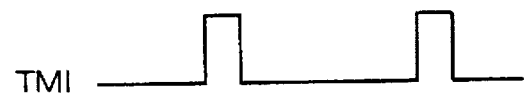
Fig.9D Purging with hydrogen 
Fig.9E Phosphine 
→ Time
Fig.10A
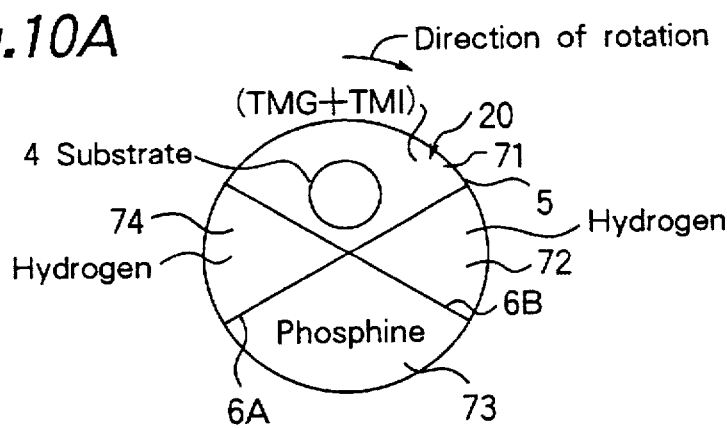
Fig.10B (TMG+TMI) 
Fig.10C Purging with hydrogen 
Fig.10D Phosphine 
→ Time

Fig.13 PRIOR ART
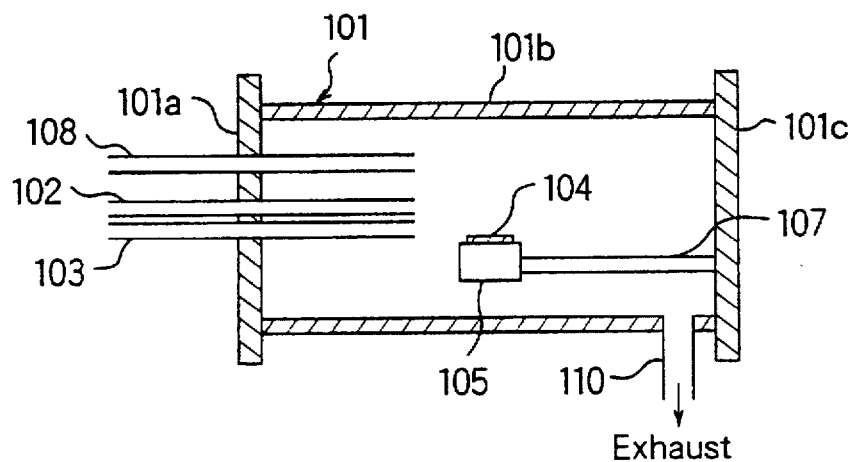
Fig.14A PRIOR ART
Fig.14B PRIOR ART
Fig.14C PRIOR ART
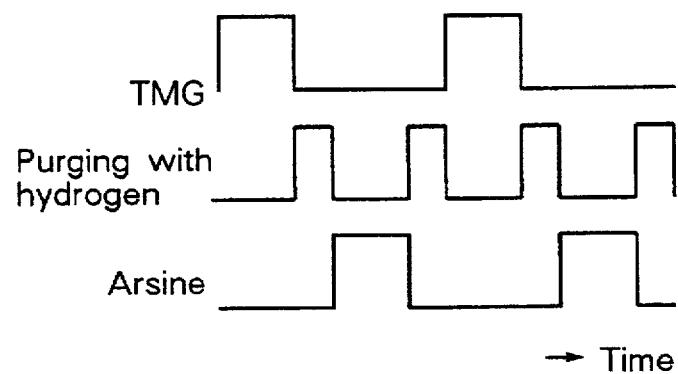

VAPOR GROWTH APPARATUS AND VAPOR GROWTH METHOD CAPABLE OF GROWING GOOD PRODUCTIVITY

This is a continuation of application Ser. No. 08/423,952, filed Apr. 18, 1995, now abandoned.

BACKGROUND OF THE INVENTION

1. Field of the Invention

The present invention relates to a vapor growth apparatus and vapor growth method for growing a compound semiconductor material, and in particular, to a vapor growth apparatus and vapor growth method for growing a compound semiconductor layer for use in a light emitting device and a high-frequency device on a substrate with a good controllability.

2. Description of the Prior Art

As a compound semiconductor material growth method, there has been well known a Metal Organic Vapor Phase Epitaxy (referred to as an MOVPE hereinafter) growth method which is used in producing a variety of devices. For the purpose of improving device performance, it has been considered that a controllability on the order of an atomic layer is required in a growth process, and accordingly an Atomic Layer Epitaxy (referred to as an ALE hereinafter) growth method has been proposed.

FIG. 13 schematically shows a vapor growth apparatus for growing GaAs by the MOVPE or ALE method. The apparatus has an approximately cylinder-shaped reaction tube 101, a supply pipe 102 for supplying trimethyl gallium (TMG) as a Ga material gas into the reaction tube 101, a supply pipe 103 for supplying arsine as an As material gas into the reaction tube 101, and a supply pipe 108 for supplying a purging-use hydrogen gas into the reaction tube 101. The supply pipes 102, 103, and 108 penetrate one end surface 101a of the reaction tube 101, and open in an approximately center portion in the axial direction of a cylindrical portion 101b of the reaction tube 101. In an approximately center portion in the axial direction of the reaction tube 101 is provided a substrate holder 105, and the substrate holder 105 is supported by an arm member 107 extending from the other end surface 101c of the reaction tube 101. In the case of either the MOVPE method or the ALE method, a GaAs substrate 104 is set on the substrate holder 105, and TMG and arsine are supplied respectively through the supply pipes 102 and 103, thereby growing GaAs on the GaAs substrate 104. Unreacted gas and the like are discharged through an exhaust pipe 110 provided on the side of the other end surface 101c of the cylindrical portion 101b. A major difference between the MOVPE method and the ALE method exists in the timing of supplying the gas. According to the MOVPE method, TMG and arsine are simultaneously supplied.

In contrast to the above, according to the ALE method, the gas supply timing is controlled by opening and closing a control valve (not shown) to alternately supply TMG and arsine. Furthermore, according to the ALE method, there is provided a period in which purging is effected with hydrogen between a TMG supply period and an arsine supply period in a manner as shown in FIGS. 14A, 14B, and 14C in order to prevent the TMG and arsine from being mixed with each other. In the period in which purging is effected with hydrogen, a hydrogen gas is supplied into the reaction tube 101 through the supply pipe 108, thereby purging the inside of the reaction tube 101.

A feature of the ALE method is to take advantage of a phenomenon that, after a ratio of coating the surface of the GaAs substrate 104 with TMG or a decomposed substance thereof becomes 1 in the TMG supply period, any further deposition is suppressed (so-called a self-limiting mechanism achieved by appropriately selecting growth conditions such as a substrate temperature). In the arsine supply period subsequent to the TMG supply period, a GaAs monatomic layer is formed on the GaAs substrate 104. By repeating the formation of the monatomic layer, a growth layer having an evenness in units of atomic layers can be obtained. In forming a hetero interface, the interfacial sharpness can be controlled in units of atomic layers.

A required thickness of the semiconductor layer in producing a variety of devices is within a range of several tens angstroms to several micrometers, the range corresponding to a thickness of several tens to several ten thousands atomic layers. Therefore, when it is attempted to grow a semiconductor layer for a variety of devices by the ALE method, the alternate supply of the material gases must be repeated several tens to several ten thousands times per growth layer. However, since the changeover between the gas supply periods has been performed by opening and closing the control valve, the control valve is required to be opened and closed very frequently. Therefore, when a durability of the control valve is taken into account, it has been unrealistic to produce, particularly, mass-produce devices by the ALE method.

SUMMARY OF THE INVENTION

The object of the present invention is therefore to provide a vapor growth apparatus and vapor growth method capable of alternately supplying a cation material gas (e.g., TMG) and an anion material gas (e.g., arsine) onto a substrate without performing such a frequent opening and closing of the control valve, thereby allowing a compound semiconductor layer having an evenness and an interfacial sharpness in units of atomic layers to be grown with a good productivity.

In order to achieve the aforementioned objective, the present invention provides a vapor growth apparatus for growing a compound semiconductor layer on a surface of a substrate maintained at a specified temperature in a growth chamber by alternately supplying a cation material gas and an anion material gas and reacting the gases, wherein the growth chamber has a cylindrical portion which extends in a direction from an upstream side to a downstream side and an end plate which closes an upstream end portion of the cylindrical portion, the end plate has in specified portions thereof a material gas supply inlet for supplying the cation material gas into the cylindrical portion and a material gas supply inlet for supplying the anion material gas into the cylindrical portion, and further comprising exhaust means for discharging gas inside the cylindrical portion from a downstream side of the cylindrical portion, a substrate holder provided between the upstream side and the downstream side of the cylindrical portion and having a substrate holding surface, gas separation means for forming a plurality of material gas supply areas where the material gases are independently supplied to the substrate holding surface by separating flow paths of the material gases extending from the material gas supply inlets to the substrate holding surface, and drive means for rotating the substrate holder with the substrate set on the substrate holding surface around a center line of the cylindrical portion.

According to the vapor growth apparatus of the present invention, the growth of the compound semiconductor layer is performed in a manner as follows. A substrate is set on a specified portion of the substrate holding surface of the substrate holder, and the substrate is maintained at a specified temperature appropriate for the growth. In the above-mentioned condition, the cation material gas and the anion material gas are supplied from the material gas supply inlets provided at the end plates of the growth chamber into the cylindrical portion. The supplied material gases are separated from each other by the gas separation means, and reach the substrate holding surface of the substrate holder from the material gas supply inlets without being mixed with each other. Consequently, a plurality of material gas supply areas to which the material gases are independently supplied are formed on the substrate holding surface. In the above place, the substrate holder is made to rotate around the center line of the cylindrical portion. Therefore, the cation material gas and the anion material gas are alternately supplied to the surface of the substrate set on the substrate holding surface. With the above-mentioned operation, a compound semiconductor layer grows on the surface of the substrate in units of atomic layers. Unreacted gas and the like are discharged by the exhaust means on the downstream side. Thus the flow paths of the material gases are separated from each other by the gas separation means, and therefore the cation material gas and the anion material gas can be alternately supplied to the surface of the substrate by rotating the substrate holder. Therefore, the control valve is not required to be frequently opened and closed for the changeover between the gas supply periods unlike the conventional case, resulting in eliminating the fear that the durability of the control valve will be impaired. Therefore, a compound semiconductor layer having an evenness and an interfacial sharpness in units of atomic layers is grown with a good productivity.

According to the vapor growth apparatus of an embodiment, the substrate holding surface of the substrate holder is perpendicular to the center line of the cylindrical portion and has a circular configuration, and the center of the substrate holding surface exists in the center line of the cylindrical portion.

With the above-mentioned arrangement, the gap between the substrate holder and the interior wall of the cylindrical portion is made constant with regard to the entire circumference of the substrate holder. Consequently, the conductance of exhaust is made constant with regard to the entire circumference of the substrate holder. Therefore, even when the substrate holder is rotated, no influence is exerted on the flow rate of each material gas. Therefore, the compound semiconductor layer is grown with a good controllability.

According to the vapor growth apparatus of an embodiment, the gas separation means is comprised of at least one partition plate provided in a plane which includes the center line of the cylindrical portion and passes between the plural number of material gas supply inlets.

With the above-mentioned arrangement, the flow paths of the material gases are simply effectively separated from each other.

According to the vapor growth apparatus of an embodiment, the partition plates extend radially from the center line of the cylindrical portion to the interior wall of the cylindrical portion and intersect each other at a specified angle, where the angle is set according to the durations of the periods in which the material gases are supplied to the substrate.

In the present case, by increasing the setting level of the rotating speed (constant speed) of the substrate holder, the material gas supply periods for forming the compound semiconductor layer are each set at the necessary minimum duration. Therefore, the productivity is increased. Furthermore, since the drive means is required to rotate the substrate holder at a constant speed, a simplified rotation control is achieved.

According to the vapor growth apparatus of an embodiment, a separation gas supply inlet for supplying separation gas having a characteristic that makes no contribution to growth reaction on the surface of the substrate is provided between the material gas supply inlets at the end plate. The gas separation means is comprised of a flow of the separation gas in a layer form extending from the separation gas supply inlet to the substrate holding surface.

In the present case, the flow paths of the material gases can be separated from each other without providing any additional member inside the cylindrical portion, thereby allowing a simplified maintenance to be achieved.

According to the vapor growth apparatus of an embodiment, the substrate holding surface of the substrate holder has a configuration corresponding to an exterior side surface of a pyramidal frustum having a center line coinciding with the center line of the cylindrical portion.

In the present case, the area of the substrate holding surface can be expanded more than in the case where the substrate holding surface is provided perpendicular to the center line of the cylindrical portion. When the above-mentioned arrangement is adopted, a lot of substrates can be set on the substrate holding surface, thereby allowing an increased productivity to be achieved.

According to the vapor growth apparatus of an embodiment, the substrate holding surface of the substrate holder has a configuration corresponding to an interior side surface of a prism-shaped pipe having a center line coinciding with the center line of the cylindrical portion.

With the above-mentioned arrangement, the area of the substrate holding surface can be expanded more than in the case where the substrate holding surface is provided perpendicular to the center line of the cylindric&l portion. When the above-mentioned arrangement is adopted, a lot of substrates can be set on the substrate holding surface, whereby an increased productivity is achieved.

The present invention provides a vapor growth method comprising the steps of: holding a substrate on a substrate holding surface of a substrate holder arranged between an upstream side and a downstream side of a cylindrical portion of a growth chamber having the cylindrical portion which extends in one direction from the upstream side to the downstream side and an end plate which closes an upstream end portion of the cylindrical portion, maintaining the substrate at a specified temperature, forming material gas supply areas where material gases are independently supplied to corresponding portions of the substrate holding surface by supplying a cation material gas and an anion material gas from the upstream side through a plurality of material gas supply inlets into the cylindrical portion while preventing the material gases from being mixed with each other inside the cylindrical portion by gas separation means and discharging the material gases out of the cylindrical portion, and rotating the substrate holder around a center line of the cylindrical portion.

According to the vapor growth method of an embodiment, the gas separation means is comprised of at least one partition plate arranged in a plane which includes the center line of the cylindrical portion and passes between the plural number of material gas supply inlets, and a rotating speed of the substrate holder is increased when the substrate traverses the plane in which the partition plate exists, and the rotating speed of the substrate holder is reduced or temporarily stopped when the substrate is located in each of the material gas supply areas.

With the above-mentioned arrangement, the transitional period in which the cation material gas is supplied to a part of the surface of the substrate and the anion material gas is supplied to the remaining part of the surface of the substrate is substantially eliminated. Therefore, growth of an atomic layer having an excellent interfacial sharpness is achieved.

According to the vapor growth method of an embodiment, the rotating speed of the substrate holder rotating around the center line of the cylindrical portion is changed according to the duration of the period in which each material gas is supplied to the substrate. For instance, when the substrate passes through the supply area of the material gas which requires a short supply time, the rotating speed of the substrate holder is increased. When the substrate passes through the supply area of the material gas which requires a long supply time, the rotating speed of the substrate holder is reduced. With the above-mentioned arrangement, each material gas supply period for forming the compound semiconductor layer is set at the necessary minimum duration. Therefore, an increased productivity is achieved.

According to the vapor growth method of an embodiment, there are prepared two or more types of at least one of the cation material gas and the anion material gas, and the two or more types of material gases are supplied into the cylindrical portion through different material gas supply inlets, whereby two or more atomic layers are grown in one turn of the substrate holder.

In the present case, a compound semiconductor layer having a composition of a variety of types is grown.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a diagram schematically showing the construction of a vapor growth apparatus according to a first embodiment of the present invention;

FIG. 2A is a plan view for explaining a vapor growth method performed by means of the vapor growth apparatus shown in FIG. 1;

FIGS. 2B and 2C are charts for explaining the vapor growth method of FIG. 2A;

FIGS. 3A and 3B are plan views for explaining vapor growth methods which are modifications of the vapor growth method of FIG. 2A.

FIGS. 3C and 3D are charts for explaining the vapor growth methods of FIGS. 3A and 3B;

FIG. 4 is a diagram showing the construction of a vapor growth apparatus according to a second embodiment of the present invention;

FIG. 5A is a plan view for explaining a vapor growth method performed by means of the vapor growth apparatus shown in FIG. 4;

FIGS. 5B, 5C and 5D are charts for explaining the vapor growth method of FIG. 5A;

FIG. 6 is a diagram showing the construction of a vapor growth apparatus according to a third embodiment of the present invention;

FIG. 7A is a plan view for explaining a vapor growth method performed by means of the vapor growth apparatus shown in FIG. 6;

FIGS. 7B, 7C and 7D are charts for explaining the vapor growth method of FIG. 7A;

FIG. 8A is a plan view for explaining another vapor growth method performed by means of the vapor growth apparatus shown in FIG. 4;

FIGS. 8B, 8C, 8D, 8E, 8F and 8G are charts for explaining the vapor growth method of FIG. 8A;

FIG. 9A is a plan view for explaining a vapor growth method performed by means of a modification of the vapor growth apparatus shown in FIG. 6;

FIGS. 9B, 9C, 9D and 9E are charts for explaining the vapor growth method of FIG. 9A;

FIG. 10A is a plan view for explaining another vapor growth method performed by means of the vapor growth apparatus shown in FIG. 6;

FIGS. 10B, 10C and 10D are charts for explaining the vapor growth method of FIG. 10A;

FIG. 13 is a diagram showing a conventional vapor growth apparatus; and

FIGS. 14A, 14B and 14C are charts for explaining a vapor growth method performed by means of the conventional vapor growth apparatus.

DETAILED DESCRIPTION OF THE PREFERRED EMBODIMENTS

Figure 11:
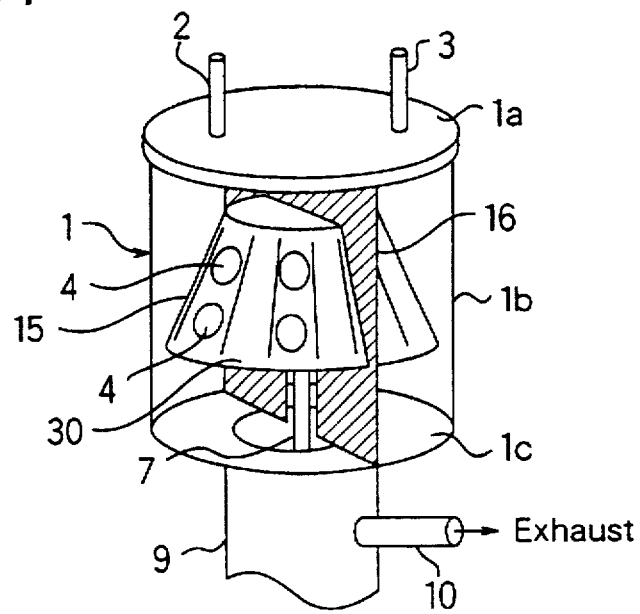
FIG. 11 is a diagram showing the construction of a vapor growth apparatus according to a fourth preferred embodiment of the present invention.

The vapor growth apparatus and vapor growth method of the present invention will be described in detail based on several embodiments thereof with reference to the accompanying drawings.

FIG. 1 shows the construction of a vapor growth apparatus according to a first embodiment of the present invention. The vapor growth apparatus has an approximately cylinder-shaped growth chamber 1. The growth chamber 1 has a cylindrical portion 1b which extends in a vertical direction, a lid portion 1a which serves as an end plate for closing an upstream end portion of the cylindrical portion 1b, and a bottom portion 1c for closing the downstream end of the cylindrical portion 1b. At the lid portion 1a, a supply inlet 2 for supplying a cation material gas into the growth chamber 1 and a supply inlet 3 for supplying an anion material gas into the growth chamber 1 are provided in positions symmetrical about the center of the lid portion 1a. Below the growth chamber 1 is vertically provided a cylindrical support pipe 9 which has a diameter smaller than that of the cylindrical portion 1b and supports the growth chamber 1. The growth chamber 1 is communicated with the support pipe 9 through an opening provided at the center of the bottom portion 1c, and the support pipe 9 is communicated with an exhaust pipe 10 provided at a peripheral surface thereof. Gas existing inside the cylindrical portion 1b of the growth chamber 1 is discharged through the support pipe 9 and the exhaust pipe 10 by a vacuum pump (not shown) which serves as an exhaust means. Inside the support pipe 9 are provided a drive shaft 7 and a drive motor (not shown) which serve as a drive means.

At an approximately middle level of the cylindrical portion 1b is provided a disk-shaped substrate holder 5 horizontally, i.e., perpendicular to the center line of the cylindrical portion 1b. An upper surface 20 of the substrate holder 5 faces the material gas supply inlets 2 and 3 at the lid portion 1a, and serves as a substrate holding surface on which a substrate 4 is set in a growth stage. The center of the substrate holder 5 exists in the center line of the cylindrical portion 1b, and the outer diameter size of the substrate holder 5 is set smaller than the inner diameter size of the cylindrical portion 1b. Consequently, there is achieved a constant gap between the substrate holder 5 and the interior wall of the cylindrical portion 1b with regard to the entire circumference. Therefore, a constant conductance of exhaust in a growth stage is achieved with regard to the entire circumference of the substrate holder 5. Even when the substrate holder 5 is rotated, no influence is exerted on the flow rate of each material gas. Therefore, a compound semiconductor layer can be grown on the substrate 4 with a good controllability in a manner as described hereinafter.

The substrate holder 5 is supported by the drive shaft 7 extending from the drive motor inside the support pipe 9 provided below. The axial center of the drive shaft 7 coincides with the center line of the cylindrical portion 1b, and a tip end of the drive shaft 7 is connected to the center of a lower surface of the substrate holder 5. In the growth stage, the substrate holder 5 is rotated around the center line of the cylindrical portion 1b by the drive motor via the drive shaft 7. The substrate holder 5 has therein a built-in heater (not shown) which generates heat by receiving electricity, thereby allowing the entire area of the substrate holding surface 20 to be uniformly maintained at a specified temperature in the growth stage.

Inside the cylindrical portion 1b is provided a partition plate 6 which serves as a gas separation means. The partition plate 6 is arranged in a plane which includes the center line of the cylindrical portion 1b and passes between the material gas supply inlets 2 and 3, thereby separating the inside of the cylindrical portion 1b into two areas corresponding to the respective material gas supply inlets 2 and 3. The partition plate 6 is put in contact with the interior walls of the lid portion 1a, the cylindrical portion 1b, and the bottom portion 1c. In a portion where the above-mentioned plane intersects the substrate holder 5 and the drive shaft 7, the partition plate 6 is formed with a cut portion along the configurations of the members 5 and 7 so that the members 5 and 7 can rotate without friction. The partition plate 6 separates the flow paths of the material gases extending from the material gas supply inlets 2 and 3 to the substrate holding surface 20 from each other in the growth stage, thereby forming two material gas supply areas where the material gases are independently supplied to the substrate holding surface 20. Since the partition plate 6 is a mere plate, the flow paths of the material gases can be separated from each other simply and effectively.

By means of the above-mentioned vapor growth apparatus, a GaAs layer is to be grown as a compound semiconductor layer on the GaAs substrate 4.

The substrate 4 is set between the center and the periphery of the substrate holding surface 20 of the substrate holder 5. The substrate 4 is maintained at a specified temperature (400° to 550° C.) by the built-in heater of the substrate holder 5. Under the above-mentioned condition, trimethyl gallium (TMG) which serves as a cation material gas and arsine which serves as an anion material gas are supplied into the cylindrical portion 1b through the material gas supply inlets 2 and 3. It is to be noted that the flow rate of TMG is set at 20 SCCM, the flow rate of arsine is set at 200 SCCM, and the TMG and arsine are each accelerated by hydrogen gas at a flow rate of 5 SLM. Meanwhile, the gas inside the cylindrical portion 1b is discharged by the vacuum pump through the support pipe 9 and the exhaust pipe 10 provided on the downstream side, whereby a pressure of 20 Torr is achieved inside the growth chamber 1. As a result, a high-speed gas flow is generated inside the cylindrical portion 1b.

The TMG and arsine supplied into the cylindrical portion 1b through the material gas supply inlets 2 and 3 are separated from each other by the partition plate 6, and then reach the substrate holding surface 20 of the substrate holder 5 without being mixed with each other. Consequently, as shown in FIG. 2A, two material gas supply areas (a TMG supply area and an arsine supply area) 21 and 22 to which the TMG and arsine are independently supplied are formed on the substrate holding surface 20. In the above-mentioned situation, the substrate holder 5 is rotated around the center line of the cylindrical portion 1b by the drive motor. Therefore, the TMG and arsine are alternately supplied to the surface of the substrate 4 set on the substrate holding surface 20 in a manner as shown in FIGS. 2B and 2C. In other words, a gas supply cycle composed of two periods of a TMG supply period and an arsine supply period is formed. Assuming that the rotating speed of the substrate holder 5 is six turns per minute (constant speed), the GaAs substrate 4 is put in contact with each of the TMG and arsine for 5 seconds. Through the above-mentioned process, a GaAs monatomic layer (having a thickness of about 2.8 Å) was able to be grown on the surface of the substrate 4 every one turn.

As described above, since the flow paths of the material gases are separated from each other by the partition plate 6 in the present vapor growth apparatus the cation material gas and the anion material gas can be alternately supplied to the surface of the substrate 4 by rotating the substrate holder 5. The above-mentioned arrangement obviates the need of frequently opening and closing the control valve for the changeover between the material gas supply periods unlike the conventional case, resulting in eliminating the fear that the durability of the control valve will be impaired. Furthermore, control factors in performing the atomic layer growth by means of the present vapor growth apparatus are growth chamber pressure, substrate temperature, gas flow rate, and the rotating speed of the substrate holder, which can be easily controlled.

Therefore, a compound semiconductor layer having an evenness and an interfacial sharpness in units of atomic layers can be grown with a good productivity. With the above-mentioned arrangement, light emitting devices and high-frequency devices having excellent evenness and interfacial sharpness can be produced.

Furthermore, since the gas inside the cylindrical portion 1b is speedily discharged by the vacuum pump, there is generated no convection inside the cylindrical portion 1b. Furthermore, since the gap between the substrate holder 5 and the interior wall of the cylindrical portion 1b is made constant with regard to the entire circumference, no influence is exerted on the flow rate of the TMG and arsine even when the substrate holder 5 is rotated. Therefore, as described hereinbefore, the GaAs layer can be grown on the substrate 4 with a good controllability.

It is to be noted that, when trimethyl aluminum (TMA) is used as the anion material gas instead of TMG, two atomic layers (having a thickness of about 5.7 Å) can be grown in one turn.

Furthermore, although the rotating speed of the substrate holder 5 is made constant, the present invention is not limited to this. For instance, it is acceptable to increase the rotating speed of the substrate holder 5 when the substrate 4 passes just below the partition plate 6 and reduce the rotating speed or temporarily stop the rotation of the substrate holder 5 when the substrate 4 is located in a position other than the position just below the partition plate 6. With the above-mentioned arrangement, a transitional period in which the TMG is supplied to a part of the surface of the substrate 4 and the arsine is supplied to the remaining part of the surface of the substrate 4 is substantially eliminated. Therefore, growth of an atomic layer having an excellent interfacial sharpness is achieved.

As is known, there is required a time of several seconds to form a TMG monomolecular deposition layer on the GaAs substrate 4. However, a time shorter than the above-mentioned time is sufficient for the growth of the GaAs monatomic layer through reaction with arsine. In the aforementioned case, it is considered that the arsine supply period is set longer than required.

Therefore, as shown in FIG. 3A, the rotating speed of the substrate holder 5 may be changed according to the duration of the period in which each of TMG and arsine is supplied to the substrate 4. For instance, the rotating speed at the time when the substrate 4 passes through the arsine supply area 22 is made greater than the rotating speed at the time when the substrate 4 passes through the TMG supply area 21. With the above-mentioned arrangement, the TMG supply period and the arsine supply period for forming the GaAs layer can be each set at the necessary minimum duration in a manner as shown in FIG. 3C. Therefore, the productivity can be increased.

Furthermore, in a manner as shown in FIG. 3B, it is acceptable to make constant the rotating speed of the substrate holder 5, make a partition plate 6' extend radially from the center line to the interior wall of the cylindrical portion 1b making a specified angle, and set the angle according to the duration of the period in which each of the TMG and arsine is supplied to the substrate 4. In the present case, by increasing the setting level of the rotating speed (constant speed) of the substrate holder 5, the TMG supply period and the arsine supply period for forming the GaAs layer can be each set at the necessary minimum duration in a manner as shown in FIGS. 3C and 3D. Therefore, the productivity can be increased. Furthermore, since the substrate holder 5 is allowed to rotate at a constant speed, the rotation control can be easily performed.

FIG. 4 shows the construction of a vapor growth apparatus according to a second embodiment of the present invention. It is to be noted that the same components as those shown in FIG. 1 are denoted by the same reference numerals, and no description therefor is provided herein.

The present vapor growth apparatus uses a separation gas having a characteristic that makes no contribution to the growth reaction on the surface of the substrate 4 instead of the partition plate 6 of the vapor growth apparatus shown in FIG. 1. In detail, separation gas supply inlets 8, 8, and 8 for supplying a separation gas are provided in a straight line passing between the material gas supply inlets 2 and 3 at the lid portion 1a of the growth chamber 1. In the growth stage, a layer-like flow of the separation gas extending from the separation gas supply inlets 8, 8, and 8 to the substrate holding surface 20 is formed.

By means of the above-mentioned vapor growth apparatus, a GaAs layer is grown as a compound semiconductor layer on the GaAs substrate 4 in the same manner as in the previous embodiment. Trimethyl gallium (TMG) is used as a cation material gas, arsine is used as an anion material gas, and hydrogen is used as a separation gas. There is provided the same growth condition as that of the previous embodiment, i.e., the condition of a substrate temperature of 400° to 550° C., a pressure of 20 Torr inside the growth chamber 1, a TMG flow rate of 20 SCCM, an arsine flow rate of 200 SCCM, and acceleration of the TMG and arsine with hydrogen gas each at a flow rate of 5 SLM. The flow rate of the separation-use hydrogen gas is set at 10 SLM at each inlet. The rotating speed of the substrate holder 5 is six turns per minute (constant speed).

The TMG and arsine supplied into the cylindrical portion 1b through the material gas supply inlets 2 and 3 are separated from each other by the flow of the hydrogen gas in a layer form, and then reach the substrate holding surface 20 of the substrate holder 5 without being mixed with each other. Consequently, as shown in FIG. 5A, a TMG supply area 31 and an arsine supply area 32 are separated from each other by a separation area 33 achieved by the hydrogen gas on the substrate holding surface 20. In the above-mentioned situation, the substrate holder 5 is rotated around the center line of the cylindrical portion 1b shown in FIG. 4. Consequently, as shown in FIGS. 5B, 5C and 5D, there is formed a gas supply cycle composed of four periods of a TMG supply period, a separation period by means of hydrogen, an arsine supply period, and a separation period by means of hydrogen. With the above-mentioned arrangement, a GaAs monatomic layer was able to be grown on the surface of the substrate 4 every one turn.

In the present vapor growth apparatus, the flow paths of the material gases can be separated from each other without providing any additional member inside the cylindrical portion 1b, which leads to an advantage that the maintenance of the apparatus can be simplified.

It is to be noted that the separation gas is not limited to the hydrogen gas, and the gas is merely required to be a gas having a characteristic that makes no contribution to the growth reaction on the surface of the substrate. For instance, the same effect can be produced when inactive gas such as argon or helium is used.

FIGS. 8A through 8G show an example in which a GaN layer is grown as a compound semiconductor layer on sapphire substrates 4A and 4B by means of the vapor growth apparatus shown in FIG. 4. Trimethyl gallium (TMG) is used as a cation material gas, ammonia is used as an anion material gas, and hydrogen is used as a separation gas.

As shown in FIG. 8A, the substrates 4A and 4B are set between the center and the periphery of the substrate holding surface 20 of the substrate holder 5 symmetrically about the center, and the substrate temperature is maintained at 500° C. Through the material gas supply inlets 2 and 3 shown in FIG. 4, the TMG and ammonia are supplied into the cylindrical portion 1b. The flow rate of TMG is set at 20 SCCM, and acceleration is performed by means of the hydrogen gas of a flow rate of 5 SLM. The flow rate of ammonia is set at 5 SLM. It is to be noted that the separation gas does not flow in this point of time. The pressure inside the growth chamber 1 is set at 760 Torr by adjusting the displacement of the vacuum pump. The rotating speed of the substrate holder 5 is set at about 2000 turns per minute. Since the separation gas is not flowed, the TMG and ammonia are mixed with each other on the two substrates 4A and 4B, thereby growing a GaN buffer layer in the normal MOVPE mode. The reason why the rotating speed of the substrate holder 5 is increased to the high value of 2000 turns per minute is to ensure a uniformity in thickness of the growth layer.

Subsequently, a GaN atomic layer is grown on the GaN buffer layer. In detail, the substrate temperature is elevated and maintained within a range of 800° to 1000° C. With the flow rates of the TMG and ammonia kept intact, hydrogen gas is flowed through the separation gas supply inlets 8, 8, and 8 at a rate of 10 SLM at each inlet. The pressure inside the growth chamber 1 is set at 200 Torr by adjusting the displacement of the vacuum pump. Then the rotating speed of the substrate holder 5 is set at about 10 turns per minute.

The TMG and ammonia supplied into the cylindrical portion 1b through the material gas supply inlets 2 and 3 are separated from each other by the flow of the hydrogen gas in a layer form, and then reach the substrate holding surface 20 of the substrate holder 5 without being mixed with each other. Consequently, in a manner as shown in FIG. 8A, a TMG supply area 51 and an ammonia supply area 52 are separated from each other by a separation area 53 achieved by the hydrogen gas on the substrate holding surface 20. In the above-mentioned situation, the substrate holder 5 is rotated around the center line of the cylindrical portion 1b shown in FIG. 4. Consequently, in regard to the substrate 4A, as shown in FIGS. 8B to 8D, there is formed a gas supply cycle composed of four periods of a TMG supply period, a separation period by means of hydrogen, an ammonia supply period, and a separation period by means of hydrogen. On the other hand, in regard to the substrate 4B, as shown in FIGS. 8E to 8G, there is formed a gas supply cycle composed of four periods of an ammonia supply period, a separation period by means of hydrogen, a TMG supply period, and a separation period by means of hydrogen in a phase reverse to that of the substrate 4A. Although the gas supply cycles of the substrates 4A and 4B are reverse to each other, there is grown a GaN layer on either one of the substrates 4A and 4B in an atomic layer growth mode. Actually, a GaN monatomic layer (having a thickness of about 2.6 Å) was able to be grown every one turn.

It is to be noted that the number of substrates is of course not limited to two, and there may be any number of substrates so long as the substrates can be mounted on the substrate holding surface 20.

FIG. 6 shows the construction of a vapor growth apparatus according to a third embodiment of the present invention. It is to be noted that the same components as those shown in FIGS. 1 and 4 are denoted by the same reference numerals, and no description therefor is provided herein.

The present vapor growth apparatus concurrently uses partition plates 6A and 6B together with a separation gas as a gas separation means. In detail, separation gas supply inlets 8 and 8 for supplying the separation gas are provided in a straight line passing between the material gas supply inlets 2 and 3 at the lid portion 1a of the growth chamber 1. On the other hand, inside the cylindrical portion 1b are provided partition plates 6A and 6B. The partition plates 6A and 6B intersect each other in the center line of the cylindrical portion 1b, thereby separating the inside of the cylindrical portion 1b into four areas corresponding to the material gas supply inlets 2 and 3 and the separation gas supply inlets 8 and 8. An angle at which the partition plates 6A and 6B intersect each other is set according to the durations of the periods in which the material gases are supplied to the substrate 4. The partition plates 6A and 6B separate the flow paths of the material gases and hydrogen gas extending from the material gas supply inlets 2 and 3 and the separation gas supply inlets 8 and 8 to the substrate holding surface 20 in the growth stage. Since the partition plates 6A and 6B and the separation gas are concurrently used, the flow paths of the material gases can be further surely separated from each other.

A zinc selenide layer is to be grown as a compound semiconductor layer on a GaAs substrate Diethyl zinc (DEZ) of one system is used as a cation material gas, hydrogen selenide of one system is used as an anion material gas, and hydrogen of two systems are used as a separation gas. There is provided a growth condition of a substrate temperature of 200° to 300° C., a pressure of 10 Torr inside the growth chamber 1, a DEZ flow rate of 10 SCCM, a hydrogen selenide flow rate of 200 SCCM, and acceleration of each of the DEZ and hydrogen selenide with hydrogen gas each at a flow rate of 3 SLM. The flow rate of the separation-use hydrogen gas is 5 SLM at each inlet. The rotating speed of the substrate holder 5 is ten turns per minute (constant speed).

As shown in FIGS. 6 and 7A, the DEZ, hydrogen selenide, and hydrogen of two systems supplied into the cylindrical portion 1b through the material gas supply inlets 2 and 3 and the separation gas supply inlets 8 and 8 are separated from each other by the partition plates 6A and 6B, and then reach the substrate holding surface 20 of the substrate holder 5 without being mixed with each other. In the present example, as shown in FIG. 7A, a DEZ supply area 41, a separation area 42 by means of hydrogen, a hydrogen selenide supply area 43, and a separation area by means of hydrogen are sequentially formed on the substrate holding surface 20 in the circumferential direction. In the above-mentioned situation, the substrate holder 5 is rotated around the center line of the cylindrical portion 1b shown in FIG. 6. Consequently, as shown in FIGS. 7B, 7C and 7D, there is formed a gas supply cycle composed of four periods of a DEZ supply period, a separation period by means of hydrogen, a hydrogen selenide supply period, and a separation period by means of hydrogen. With the above-mentioned arrangement, a zinc selenide monatomic layer (having a thickness of about 2.8 Å) was able to be grown on the surface of the substrate 4 every one turn.

It is to be noted that the number of partition plates is not limited to two. Three or more partition plates may be provided and made to intersect each other in the center line of the cylindrical portion 1b at specified angles. When the above-mentioned arrangement is adopted, the supply systems of material gases and separation gas can be increased in number by providing a supply system of a material gas or a supply system of a separation gas for every area separated by the partition plates. Therefore, various types of compound semiconductor layers can be grown on the substrate.

FIGS. 9A, 9B, 9C, 9D, and 9E show an example in which a $Ga_{0.5}In_{0.5}P$ layer is grown as a compound semiconductor layer on a GaAs substrate 4 by means of a vapor growth apparatus of which partition plates are increased in number to three and the other parts of which are similar to those of FIG. 3.

The vapor growth apparatus used herein concurrently uses partition plates 6A, 6B, and 6C as a gas separation means and two systems of hydrogen as a separation gas in a manner as shown in FIG. 9A. The partition plates 6A, 6B, and 6C are intersecting each other at specified angles in the center line of the cylindrical portion 1b shown in FIG. 6. The angles at which the partition plates 6A, 6B, and 6C intersect each other are set according to the durations of the periods in which the material gases are supplied to the substrate 4. There are used material gases of three types of four systems. In detail, one system of TMG and one system of trimethyl indium (TMI) are used as a cation material gas. There is used phosphine of two systems as an anion material gas. There is provided a growth condition of a substrate temperature of 300° to 500° C., a pressure of 20 Torr inside the growth chamber 1, a TMG flow rate of 10 SCCM, a TMI flow rate of 10 SCCM, a phosphine flow rate of 100 SCCM at each area, and acceleration of the TMG, TMI, and phosphine with hydrogen gas each at a flow rate of 3 SLM. The flow rate of the separation-use hydrogen gas is 3 SLM. The rotating speed of the substrate holder 5 is three turns per minute (constant speed).

The TMG, TMI, phosphine of two systems, and hydrogen of two systems supplied into the cylindrical portion 1b through the material gas supply inlets are separated from each other by the partition plates 6A, 6B, and 6C, and then reach the substrate holding surface 20 of the substrate holder 5 without being mixed with each other. In the present example, in a manner as shown in FIG. 9A, a TMG supply area 61, a phosphine supply area 62, a separation area 63 by means of hydrogen, a TMI supply area 64, a phosphine supply area 65, and a separation area 66 by means of hydrogen are sequentially formed in the circumferential direction on the substrate holding surface 20. In the above-mentioned situation, the substrate holder 5 is rotated around the center line of the cylindrical portion 1b shown in FIG. 6. Consequently, there is formed a gas supply cycle composed of six periods of a TMG supply period, a phosphine supply period, a separation period by means of hydrogen, a TMI supply period, a phosphine supply period, and a separation period by means of hydrogen in a manner as shown in FIGS. 9B, 9C, 9D and 9E.

With the above-mentioned arrangement, a pair of super-lattice structures of $(GaP)_1(InP)_1$ (having a thickness of about 5.6 Å) was able to be grown on the surface of the substrate 4 every one turn. A stack of the above-mentioned superlattice structures functions as a $Ga_{0.5}In_{0.5}P$ layer.

FIGS. 10A, 10B, 10C and 10D show an example in which a $Ga_{0.5}In_{0.5}P$ layer is grown as a compound semiconductor layer on a GaAs substrate 4 by means of the vapor growth apparatus shown in FIG. 6.

In a manner as shown in FIG. 10A, there are used TMG and TMI (referred to as (TMG+TMI)) as a cation material gas to be supplied concurrently to one system, and phosphine of one system is used as an anion material gas. There is used hydrogen of two systems as a separation gas. There is provided a growth condition of a substrate temperature of 300° to 500° C., a pressure of 20 Torr inside the growth chamber 1, a TMG flow rate of 5 SCCM, a TMI flow rate of 10 SCCM, a phosphine flow rate of 200 SCCM, and acceleration of the TMG, TMI, and phosphine with hydrogen gas each at a flow rate of 3 SLM. The flow rate of the separation-use hydrogen gas is 3 SLM. The rotating speed of the substrate holder 5 is three turns per minute (constant speed).

In the present example, a (TMG+TMI) supply area 71, a separation area 72 by means of hydrogen, a phosphine supply area 73, and a separation area 74 by means of hydrogen are sequentially formed in the circumferential direction on the substrate holding surface 20. In the above-mentioned situation, the substrate holder 5 is rotated around the center line of the cylindrical portion 1b shown in FIG. 6. Consequently, as shown in FIGS. 10B, 10C and 10D, there is formed a gas supply cycle composed of four periods of a (TMG+TMI) supply period, a separation period by means of hydrogen, a phosphine supply period, and a separation period by means of hydrogen.

With the above-mentioned arrangement, a $Ga_{0.5}In_{0.5}P$ monatomic layer (having a thickness of about 2.8 Å) was able to be grown on the surface of the substrate 4 every one turn.

Although the compound semiconductor layer grown on the substrate has a composition of one type in each of the aforementioned examples, the compound semiconductor layer may have compositions of a variety of types by changing the type of the material gas in the course of the growth process. Furthermore, in order to give a conductivity to the compound semiconductor layer to be grown, a material gas containing an impurity element may be used.

Although an organic metal compound is used as a cation material gas in each of the aforementioned examples, there may be used a material gas other than the organic metal compound, such as a halogen compound.

Although the growth chamber 1 has the cylindrical portion 1b which extends in a vertical direction in each of the vapor growth apparatuses shown in FIGS. 1, 4, and 6, the present invention is not limited to this. It is acceptable to arrange the cylindrical portion in a horizontal direction and flow the material gases and separation gas in the horizontal direction.

The substrate holder 5 may be a high-frequency heating type effected with provision of a coil around the cylindrical portion 1b instead of the built-in heater type.

FIG. 11 shows the construction of a vapor growth apparatus according to a fourth preferred embodiment of the present invention. It is to be noted that the same components as those shown in FIG. 1 are denoted by the same reference numerals, and no description therefor is provided herein.

In the present vapor growth apparatus, an approximately cone frustum-shaped substrate holder 15 having a center line coinciding with the center line of the cylindrical portion 1b is provided at an approximately middle level of the cylindrical portion 1b. An exterior side surface 30 of the substrate holder 15 has a pyramidal configuration (pyramidal configuration having a polygonal transverse section) rather than a conical configuration. Each segmented small surface between adjacent ridgelines of the exterior side surface 30 has a flatness such that it can allow a substrate 4 to adhere thereto, and serves as a substrate holding surface on which the substrate 4 is set in the growth stage. In the case of the present substrate holder 15, the area of the substrate holding surface 30 can be expanded more than in the case where the substrate holding surface is provided horizontally. Therefore, a lot of substrates 4, 4, . . . can be set on the substrate holding surface 30, which resulting in an improved productivity.

In the present example, a lower edge of the substrate holder 15 has a circular configuration, and its outer diameter size is set smaller than the inner diameter size of the cylindrical portion 1b. The center line of the substrate holder 15 is coinciding with the center line of the cylindrical portion 1b, and consequently a gap between the lower edge and the interior wall of the cylindrical portion 1b is made constant throughout the entire circumference. Therefore, the conductance of exhaust is made constant with regard to the entire circumference of the substrate holder 15. Even when the substrate holder 15 is rotated, no influence is exerted on the flow velocity of each material gas. Therefore, a compound semiconductor layer can be grown on the substrate 4 with a good controllability.

Furthermore, a partition plate 16 having a cut portion along the configurations of the substrate holder 15 and the drive shaft 7 is provided as a gas separation means inside the cylindrical portion 1b. The partition plate 16 is provided in a plane which includes the center line of the cylindrical portion 1b and passes between the material gas supply inlets 2 and 3, thereby separating the inside of the cylindrical portion 1b into two areas corresponding respectively to the material gas supply inlets 2 and 3. Since the flow paths of the material gases are separated from each other by the partition plate 16, a cation material gas and an anion material gas can be alternately supplied to the surface of the substrate 4 by rotating the substrate holder 15. Therefore, a compound semiconductor layer having an evenness and an interfacial sharpness in units of atomic layers can be grown with a good productivity. With the above-mentioned arrangement, light emitting devices and high-frequency devices having excellent evenness and interfacial sharpness can be produced.

Figure 12:
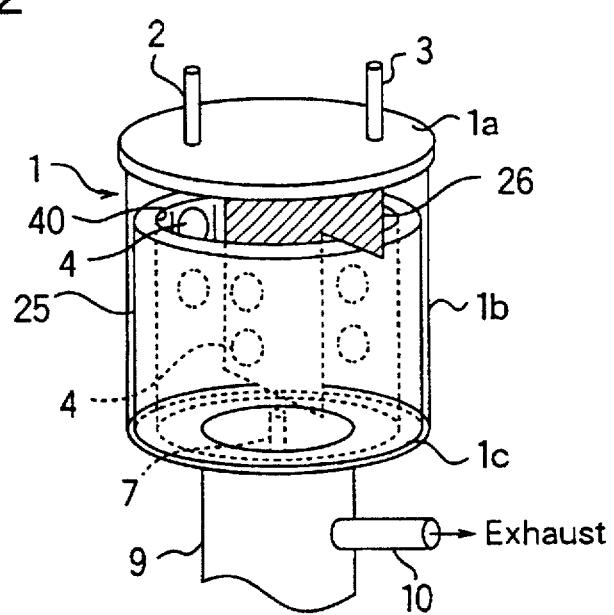
FIG. 12 is a diagram showing the construction of a vapor growth apparatus according to a fifth preferred embodiment of the present invention.

FIG. 12 shows the construction of a vapor growth apparatus according to a fifth preferred embodiment of the present invention. It is to be noted that the same components as those shown in FIG. 1 are denoted by the same reference numerals, and no description therefor is provided herein.

In the present vapor growth apparatus, an approximately cylinder-shaped substrate holder 25 having a center line coinciding with the center line of the cylindrical portion 1b is provided inside the cylindrical portion 1b. The substrate holder 25 is supported by the drive shaft 7 which extends from the drive motor inside the support pipe 9 provided below and arm members (not shown) which extends from the circumference of the drive shaft 7 to a lower end of the substrate holder 25. An interior surface 40 of the substrate holder 25 has a prismatic configuration (prismatic configuration having a polygonal transverse section) rather than a cylindrical configuration. Each segmented small surface between adjacent valleys lines of the interior surface 40 has a flatness such that it can allow a substrate 4 to adhere thereto, and serves as a substrate holding surface on which the substrate 4 is set in the growth stage. In the case of the substrate holder 25, the area of the substrate holding surface 40 can be expanded more than in the case where the substrate holding surface is provided horizontally. Therefore, a lot of substrates 4, 4, . . . can be set on the substrate holding surface 40, which resulting in an improved productivity.

In the present case, the substrate holder 25 has an approximately cylinder-shaped configuration. Therefore, even when the substrate holder 25 rotates in the growth stage, no influence is exerted on the speed of flow of each material gas. Therefore, a compound semiconductor layer can be grown on the substrate 4 with a good controllability.

Furthermore, a partition plate 26 having an approximately T-shaped configuration is provided as a gas separation means inside the cylindrical portion 1b. The partition plate 26 is provided in a plane which includes the center line of the cylindrical portion 1b and passes between the material gas supply inlets 2 and 3, thereby separating the inside of the cylindrical portion 1b into two areas corresponding respectively to the material gas supply inlets 2 and 3. Since the flow paths of the material gases are separated from each other by the partition plate 26, a cation material gas and an anion material gas can be alternately supplied to the surface of the substrate 4 by rotating the substrate holder 25. Therefore, a compound semiconductor layer having an evenness and an interfacial sharpness in units of atomic layers can be grown with a good productivity. With the above-mentioned arrangement, light emitting devices and high-frequency devices having excellent evenness and interfacial sharpness can be produced.

As is apparent from the above description, the flow paths of the material gases are separated from each other by the gas separation means in the vapor growth apparatus of the present invention, and therefore the cation material gas and the anion material gas can be alternately supplied to the surface of the substrate by rotating the substrate holder. With the above-mentioned arrangement, the control valve is not required to be frequently opened and closed for the changeover between the material gas supply periods unlike the conventional case, resulting in eliminating the fear that the durability of the control valve will be impaired. Further, a compound semiconductor layer having an evenness and an interfacial sharpness in units of atomic layers can be grown with a good productivity.

According to the vapor growth apparatus of an embodiment, the substrate holding surface of the substrate holder is perpendicular to the center line of the cylindrical portion and has a circular configuration, and the center of the substrate holding surface exists in the center line of the cylindrical portion. With the above-mentioned arrangement, the gap between the substrate holder and the interior wall of the cylindrical portion is made constant with regard to the entire circumference of the substrate holder. Consequently, the conductance of exhaust is made constant with regard to the entire circumference of the substrate holder. Therefore, even when the substrate holder is rotated, no influence is exerted on the flow speed of each material gas, and a compound semiconductor layer can be grown with a good controllability.

According to the vapor growth apparatus of an embodiment, the gas separation means is comprised of at least one partition plate provided in a plane which includes the center line of the cylindrical portion and passes between the plural number of material gas supply inlets. With the above-mentioned arrangement, the flow paths of the material gases can be simply effectively separated from each other.

According to the vapor growth apparatus of an embodiment, the partition plates extend radially from the center line to the interior wall of the cylindrical portion and intersect each other at a specified angle, and the angle is set according to a duration of a period in which each of the material gases are supplied to the substrate. Therefore, by increasing the setting level of the rotating speed (constant speed) of the substrate holder, each material gas supply period for forming the compound semiconductor layer can be set at the necessary minimum duration. Therefore, the productivity can be increased. Furthermore, since the drive means is merely required to rotate the substrate holder at a constant speed, the rotation control can be performed simply.

According to the vapor growth apparatus of an embodiment, a separation gas supply inlet for supplying the separation gas having a characteristic that makes no contribution to the growth reaction on the surface of the substrate is provided between the plural number of material gas supply inlets at the end plate. The gas separation means is comprised of a flow of the separation gas in a layer form extending from the separation gas supply inlet to the substrate holding surface. Therefore, the flow paths of the material gases can be separated from each other without providing any additional member inside the cylindrical portion, thereby allowing a simplified maintenance to be achieved.

According to the vapor growth apparatus of an embodiment, the substrate holding surface of the substrate holder has a configuration corresponding to the exterior side surface of a pyramidal frustum having a center line coinciding with the center line of the cylindrical portion. With the above-mentioned arrangement, the area of the substrate holding surface can be expanded more than in the case where the substrate holding surface is provided perpendicular to the center line of the cylindrical portion. Therefore, a lot of substrates can be set on the substrate holding surface, whereby an increased productivity is achieved.

According to the vapor growth apparatus of an embodiment, the substrate holding surface of the substrate holder has a configuration corresponding to the interior side surface of a prism-shaped pipe having a center line coinciding with the center line of the cylindrical portion. With the above-mentioned arrangement, the area of the substrate holding surface can be expanded more than in the case where the substrate holding surface is provided perpendicular to the center line of the cylindrical portion. Therefore, a lot of substrates can be set on the substrate holding surface, whereby an increased productivity is achieved.

The present invention also provides a vapor growth method comprising the steps of: holding a substrate on a substrate holding surface of a substrate holder arranged between an upstream side and a downstream side of a cylindrical portion of a growth chamber having the cylindrical portion which extends in one direction from the upstream side to the downstream side and an end plate which closes an upstream end portion of the cylindrical portion, maintaining the substrate at a specified temperature, forming material gas supply areas where material gases are independently supplied to corresponding portions of the substrate holding surface by supplying a cation material gas and an anion material gas from the upstream side through a plurality of material gas supply inlets into the cylindrical portion while preventing the material gases from being mixed with each other inside the cylindrical portion by gas separation means and discharging the material gases out of the cylindrical portion, and rotating the substrate holder around a center line of the cylindrical portion.

According to the vapor growth method of the present invention, the cation material gas and the anion material gas can be alternately supplied to the surface of the substrate by rotating the substrate holder while preventing the material gases from being mixed by the separation means, and a compound semiconductor layer having an evenness and an interfacial sharpness in units of atomic layers can be grown with a good productivity. Furthermore, the above-mentioned arrangement obviates the need of frequently opening and closing the control valve.

According to the vapor growth method of an embodiment, the rotating speed of the substrate holder is increased when the substrate traverses the plane in which the partition plate exists, and the rotating speed of the substrate holder is reduced or temporarily stopped when the substrate is located in each material gas supply area. With the above-mentioned arrangement, a transitional period in which the cation material gas is supplied to a part of the surface of the substrate and the anion material gas is supplied to the remaining part of the surface of the substrate can be substantially eliminated. Therefore, growth of an atomic layer having an excellent interfacial sharpness can be achieved.

According to the vapor growth method of an embodiment, the rotating speed of the substrate holder rotating around the center line of the cylindrical portion is changed according to the duration of the period in which each material gas is supplied to the substrate. For instance, when the substrate passes through the supply area of the material gas which requires a short supply time, the rotating speed of the substrate holder is increased. When the substrate passes through the supply area of the material gas which requires a long supply time, the rotating speed of the substrate holder is reduced. With the above-mentioned arrangement, each material gas supply period for forming the compound semiconductor layer can be set at the necessary minimum duration. Therefore, the productivity can be increased.

According to the vapor growth method of an embodiment, there are prepared two or more types of at least one of the cation material gas and the anion material gas, and the two or more types of material gases are supplied into the cylindrical portion through different material gas supply inlets, whereby two or more atomic layers are grown in one turn of the substrate holder. Therefore, a compound semiconductor layer having a composition of a variety of types can be grown.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vapor growth apparatus for growing a compound semiconductor layer on a surface of a substrate maintained at a specified temperature in a growth chamber by alternately supplying a cation material gas and an anion material gas and reacting the gases, wherein the growth chamber has a cylindrical portion which extends in a direction from an upstream side to a downstream side and an end plate which closes an upstream end portion of the cylindrical portion, the end plate has in specified portions thereof a material gas supply inlet for supplying the cation material gas into the cylindrical portion and a material gas supply inlet for supplying the anion material gas into the cylindrical portion, and further comprising exhaust means for discharging gas inside the cylindrical portion from a downstream side of the cylindrical portion, a substrate holder provided between the upstream side and the downstream side of the cylindrical portion and having a substrate holding surface, gas separation means for forming a plurality of material gas supply areas where the material gases are independently supplied to the substrate holding surface by separating flow paths of the material gases extending from the material gas supply inlets to the substrate holding surface, and drive means for rotating the substrate holder with the substrate set on the substrate holding surface around a center line of the cylindrical portion, wherein the substrate holder has a cylindrical outer surface centered about the center line and a non-cylindrical interior surface whereby the substrate holder has a polygonal transverse section, the substrate holding surface being provided on the interior surface of the substrate holder.

* * * * *

UNITED STATES PATENT AND TRADEMARK OFFICE
CERTIFICATE OF CORRECTION

PATENT NO. : 5,730,802
DATED : March 24, 1998
INVENTOR(S) : Takashi Ishizumi and Shinji Kaneiwa It is certified that error appears in the above-identified patent and that said Letters Patent is hereby corrected as shown below:

On the cover page, item [54], and Col. 1, lines 1-3, please change " "VAPOR GROWTH APPARATUS AND VAPOR GROWTH METHOD CAPABLE OF GROWING GOOD PRODUCTIVITY" TO --VAPOR GROWTH APPARATUS AND VAPOR GROWTH METHOD CAPABLE OF GROWING A COMPOUND SEMICONDUCTOR LAYER HAVING AN EVENNESS AND AN INTERFACIAL SHARPNESS IN UNITS OF ATOMIC LAYERS WITH GOOD PRODUCTIVITY--.

Signed and Sealed this

Fifteenth Day of September, 1998

Attest:

BRUCE LEHMAN

Attesting Officer  Commissioner of Patents and Trademarks